United States Patent
Lee et al.

(10) Patent No.: US 8,743,997 B2
(45) Date of Patent: Jun. 3, 2014

(54) METHOD AND APPARATUS FOR IMPROVING THROUGHPUT AND ERROR PERFORMANCE OF RATELESS CODING SYSTEMS

(75) Inventors: Chia-Han Lee, South Bend, IN (US); Wen Gao, West Windsor, NJ (US)

(73) Assignee: Thomson Licensing, Boulogne-Billancourt (FR)

( * ) Notice: Subject to any disclaimer, the term of this patent is extended or adjusted under 35 U.S.C. 154(b) by 614 days.

(21) Appl. No.: 12/451,273

(22) PCT Filed: May 3, 2007

(86) PCT No.: PCT/US2007/010771
§ 371 (c)(1),
(2), (4) Date: Jun. 1, 2010

(87) PCT Pub. No.: WO2008/136792
PCT Pub. Date: Nov. 13, 2008

(65) Prior Publication Data
US 2010/0239048 A1    Sep. 23, 2010

(51) Int. Cl.
*H04L 27/00*    (2006.01)
(52) U.S. Cl.
USPC ............. 375/295; 327/291; 332/106; 341/20
(58) Field of Classification Search
USPC ........................................................ 375/295
See application file for complete search history.

(56) References Cited

U.S. PATENT DOCUMENTS

| | | | | |
|---|---|---|---|---|
| 6,445,312 | B1 * | 9/2002 | Nguyen | 341/50 |
| 7,146,552 | B2 * | 12/2006 | Kim et al. | 714/755 |
| 7,447,269 | B2 * | 11/2008 | Tamaki et al. | 375/260 |
| 7,664,198 | B2 * | 2/2010 | Kalhan et al. | 375/295 |
| 7,869,539 | B2 * | 1/2011 | Shapiro | 375/295 |
| 2004/0187070 | A1 * | 9/2004 | LaBerge | 714/790 |
| 2005/0135497 | A1 * | 6/2005 | Kim et al. | 375/267 |
| 2005/0141549 | A1 | 6/2005 | Dottling et al. | |

(Continued)

FOREIGN PATENT DOCUMENTS

| EP | 1357681 | 6/2005 |
|---|---|---|
| JP | 11355373 A2 | 12/1999 |

(Continued)

OTHER PUBLICATIONS

Ma et al.:"Fountain Codes and Applications to Reliable Wireless Broadcast System," Information Theory Workshop, IEEE, Oct. 22, 2003, pp. 66-70.

(Continued)

*Primary Examiner* — Santiago Garcia
(74) *Attorney, Agent, or Firm* — Robert D. Shedd; Jeffrey M. Navon

(57) ABSTRACT

A method and system are described for adaptively adjusting data communication of a rateless coding system, including adaptively estimating a symbol coding length, determining a symbol threshold, determining if the adaptively estimated symbol coding length is less than the symbol threshold, adjusting a transmission power level based on the second determining act and adaptively adjusting a modulation scheme based on the second determining act. Also described are a method and system for decoding communication of a rateless coding system, including receiving encoded symbols, determining if a length of the received encoded symbols is greater than a threshold number of encoded symbols and decoding the received encoded symbols if the length of the received encoded symbols is greater than the threshold number of encoded symbols.

24 Claims, 15 Drawing Sheets

(56) References Cited

U.S. PATENT DOCUMENTS

| | | | |
|---|---|---|---|
| 2006/0045117 A1* | 3/2006 | Qi et al. | 370/445 |
| 2006/0062243 A1* | 3/2006 | Dacosta | 370/464 |
| 2007/0223580 A1* | 9/2007 | Ye et al. | 375/240.12 |
| 2007/0223620 A1* | 9/2007 | Kalhan et al. | 375/295 |
| 2007/0270173 A1* | 11/2007 | Niu et al. | 455/522 |
| 2008/0240011 A1* | 10/2008 | Kim et al. | 370/312 |

FOREIGN PATENT DOCUMENTS

| | | |
|---|---|---|
| JP | 2001520480 A | 10/2001 |
| JP | 2004517534 A | 6/2004 |
| JP | 2007019729 A2 | 1/2007 |
| KR | 1020040053349 | 6/2004 |
| KR | 1020040095366 | 11/2004 |
| WO | 9920016 A1 | 4/1999 |
| WO | 02052862 A2 | 7/2002 |
| WO | WO03047198 | 6/2003 |
| WO | 2007109216 A1 | 9/2007 |

OTHER PUBLICATIONS

Luby et al.: Institute of Electrical and Electronics Engineer, "LT Codes," 43$^{rd}$ Annual Symposium on Foundations of Computer Science, Nov. 16, 2002, pp. 271-280.

T.M Cover, Thomas: Elements of Information Theory, 2$^{nd}$ Edition, 2006, Wiley-Interscience, p. 19-26.

Palanki et al.:"Rateless Codes on Noisy Channels," 2005, pp. 1-3.

European Search Report dated Sep. 30, 2008.

Sasaki, "Add-on Request Method for Multicast Content Distribution using LT Codes", IPSJ Technical Report, (Groupware and Network Service), Information Processing Society of Japan, Japan, pp. 134-146.

Valenti_etal_Iterative_Solutions_Coded_Modulation_Library_Theory_of_Operation_Oct. 3, 2005_slides_1_to_17, West Virginia University, Morgantown, W VA, Oct. 3, 2005.

Cover, TM. et al., Elements of information theory second edition gaussian channel, chapter 9, pp. 261-266.

Liu, Y., A lossless layered coding strategy for MIMO systems 2005 IEEE, ISIT 2005, pp. 1947-1951.

Shokrollahi: Raptor Codes, IEEE Transactions on Information Theory, vol. 52, Issue 6, Jun. 2006 pp. 2551-2567.

Ghanim etal: "The Throughput of hybrid-ARQ in block fading under modulation constraints", CISS 2006. pp. 1-12.

Costello et al.: "Applications of error-control coding", IEEE Transactions on Information Theory, vol. 44, Issue 6, Oct. 1998 pp. 2531-2560.

\* cited by examiner

METHOD AND APPARATUS FOR IMPROVING THROUGHPUT AND ERROR PERFORMANCE OF RATELESS CODING SYSTEMS

This application claims the benefit, under 35 U.S.C. §365 of International Application PCT/US2007/10771 and filed May 3, 2007, which was published in accordance with PCT Article 21(2) on Nov. 13, 2008, in English.

FIELD OF THE INVENTION

The present invention relates to coding schemes and in particular to improving throughput and error performance of rateless (also known as fountain) coding schemes.

BACKGROUND OF THE INVENTION

Unlike block codes or convolutional codes, the rate is specified in rateless codes. Rateless coding schemes known in the art include Luby Transform (LT) codes and Raptor codes. Fountain codes (also known as rateless erasure codes) are a class of erasure codes with the property that a potentially limitless sequence of encoding symbols can be generated from a given set of source symbols such that the original source symbols can be recovered from any subset of the encoding symbols of size equal to or only slightly larger than the number of source symbols. A fountain code is optimal if the original k source symbols can be recovered from any k encoding symbols. Fountain codes are known that have efficient encoding and decoding algorithms and that allow the recovery of the original k source symbols from any k' of the encoding symbols with high probability, where k' is just slightly larger than k. Rateless coding schemes were originally applied to erasure channels, and more recently to noisy channels. Some conventional rateless coding schemes use length estimation, which is any scheme which estimates or predicts how many bits or symbols are needed for successful decoding of a rateless code.

Theoretically, length estimation can predict the required length of rateless codes in a communications system. However, in practice, when applying length estimation to rateless code communication systems, the error rate is high because rateless codes do not reach the channel capacity in many situations. Channel capacity is a measure of the maximum number of information/data bits per symbol that can be transmitted and reliably received. As a result, additional decoding overhead on the receive side is required to compensate for the incorrect length estimation on the transmit side.

Some prior art length estimation methods account for this by applying a static scaling factor. In some conventional rateless coding schemes using length estimation, a fixed scaling factor is applied to the length estimation to compensate for inaccurate code length estimations. If the fixed scaling factor is equal to one, then it is effectively uncompensated.

There was no power adjustment in prior art rateless coding schemes. If the required number of coded bits was too much at the given power level, then errors would occur because not enough coded bits could be transmitted before the deadline. That is, there was no option to improve the SNR by increasing the power level and thus reduce the number of coded bits that should be transmitted in order to be successfully decoded at the receiver side. On the receive side, there was correspondingly no consideration given in the prior art to increasing the power at the transmitter side in order to increase the ability of the receiver to decode the transmitted coded bits before the deadline. If the SNR was good then little was to be gained by increasing the power level.

In prior art rateless coding schemes, length estimations were not adaptive nor was adaptive modulation employed. That is, if too many coded bits were required to be transmitted such that it was impossible to meet the deadline, then there was no alternative but to incur the errors and performance degradation.

It would be advantageous to apply adaptive length estimation, adaptive modulation and power adjustments to rateless/fountain coding schemes. As used herein, "/" denotes alternative names for the same or similar components or ideas. That is, "/" can be taken to mean "or" herein.

SUMMARY OF THE INVENTION

The present invention includes several methods for improving the throughput and error performance of rateless coding schemes including prior art rateless coding schemes that use length estimation. The methods of the present invention also increase the probability of successful decoding before the deadline, save transmitter power by sending fewer symbols and save receiver power by requiring less decoding computation. The methods of the present invention include adaptive length estimation, power adjustment, and adaptive modulation. The methods of the present invention fit into 3G HSDPA standard and are suitable for next generation communication systems.

Usually, the reliability and throughput of a communication system are in conflict. That is, if the throughput increases then the error performance suffers and vice versa. Use of the methods described herein, however, not only achieves excellent error rate performance but also increases throughput of rateless code systems applying length estimation. Moreover, there is a significant power savings for both the transmitter and receiver by more accurate and adaptive length estimation. The throughput is increased by applying adaptive modulation and power adjustments, which increases the probability of successful decoding before the deadline.

To further conserve power (by transmitting fewer bits) while accurately estimating the required length, a new adaptive length estimation scheme utilizing adaptive scaling factor is described herein. For different SNRs, the required encoding overhead is different, so a different scaling factor for different channels under different SNRs is desirable.

A practical communication system (for example, a multimedia communication system) usually has deadlines to communicate information/data. Once the deadline has been reached, if the data/information has not been received or properly decoded then the communication system has to give up. This is particularly true in multimedia or streaming communication systems where the data needs to be displayed by a certain time or deadline. In rateless coding systems, if the required number of coded information/data bits for successful decoding cannot be communicated before the deadline is reached, the receiver gives up and errors occur. The present invention applies adaptive length estimation, power adjustment and adaptive modulation to rateless coding systems/schemes to solve the above identified problems. Power adjustment results in fewer coded bits being required for transmission and decoding. Adaptive modulation further improves the performance and shortens the time that is required to transmit the same number of coded bits due to more efficient channel capacity and a higher number bits per symbol being possible.

The methods of the present invention solve the performance degradation problems of prior art schemes and have the following additional advantages:
1. Save transmitter power because fewer bits are transmitted due to early deadline completion.
2. Save receiver power because much less computation is needed for decoding due to accuracy of length estimation.
3. Performance improvement in a rateless coding system includes higher throughput and a lower error rate.

A method and system are described for adaptively adjusting data communication of a rateless coding system, including adaptively estimating a symbol coding length, determining a symbol threshold, determining if the adaptively estimated symbol coding length is less than the symbol threshold, adjusting a transmission power level based on the second determining act and adaptively adjusting a modulation scheme based on the second determining act. Also described are a method and system for decoding communication of a rateless coding system, including receiving encoded symbols, determining if a length of the received encoded symbols is greater than a threshold number of encoded symbols and decoding the received encoded symbols if the length of the received encoded symbols is greater than the threshold number of encoded symbols.

BRIEF DESCRIPTION OF THE DRAWINGS

The present invention is best understood from the following detailed description when read in conjunction with the accompanying drawings. The drawings include the following figures briefly described below:

FIG. 4C is a continuation of FIG. 4B.

DETAILED DESCRIPTION OF THE PREFERRED EMBODIMENTS

Figure 1A:
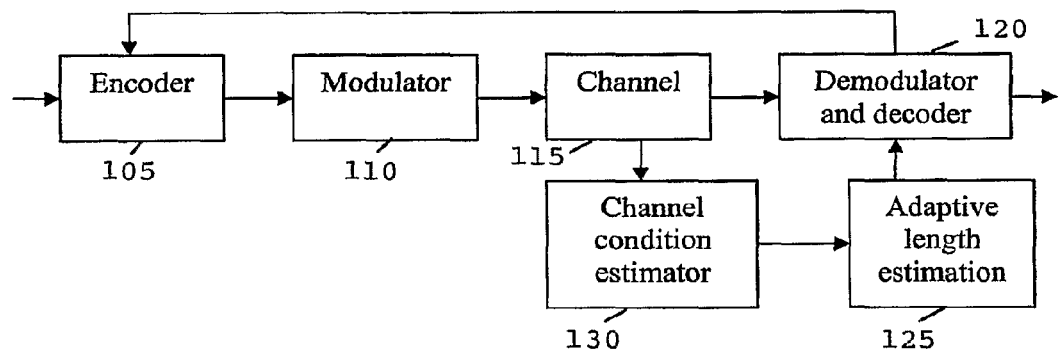
FIG. 1A is a block diagram of one embodiment of the present invention.

For an (N, K) code, N coded bits are used to represent K information/data bits by adding redundancy to the coded bits. K/N is defined as the code rate, which is usually specified for a block code or a convolutional code.

Unlike block codes or convolutional codes, the rate is unspecified in rateless codes. Given K information bits, the rateless code encoder generates coded bits by randomly selecting some bits from the given information/data bits and performing certain operations (usually an exclusive-or) on them. The encoder continues generating coded bits until the decoder is able to successfully decode the encoded data/information or the deadline is reached and an error occurs. The ability of the decoder to decode the encoded information/data bits is determined by the encoder based on the length estimation, which is, in turn, based on the channel conditions. Channel conditions can be estimated through training signals. For example, training signals having training data can be sent at the beginning of every data frame and are used by the receiver to estimate channel conditions. The receiver can send the channel conditions back to the transmitter through a control/auxiliary channel. In the alternative, the receiver can report error performance to the transmitter and based on the reported error performance the transmitter can estimate the channel conditions. Any other known means for the transmitter-receiver pair to determine/estimate the channel conditions may be used. Under different channel conditions, the length (number of coded bits) required for successful decoding varies. If channel conditions are known, the code length can be estimated. One length estimation method uses the following formula:

$$L > \frac{K}{I(X;Y)}\gamma \qquad \text{(Equation 1)}$$

where L is required encoded symbol length which equals to the required coded bit length divided by the number of bits per symbol, K is the information/data bit length, I(X;Y) is the mutual information between the transmitted symbol X and the received symbol Y, which is defined as $$I(X;Y) = E\left[\log\frac{f_{XY}(X;Y)}{f_X(X)f_Y(Y)}\right],$$

where $f_X(X)$ and $f_Y(Y)$ are probability density functions (PDFs) of the transmitted symbol X and the received symbol Y respectively and $f_{XY}(X;Y)$ is the joint probability density function of symbol X and Y. The mutual information depends on channel SNR and the modulation scheme. In general, I(X;Y) lacks a closed form and can be pre-computed and stored in a look-up table. γ is the scaling factor. If the channel is block-based, such as a block fading channel, or the codes are transmitted block-by-block, the formula can be written as $$\sum_{i=1}^{N} \frac{I_i L_i}{\gamma} > K, \quad \text{(Equation 2)}$$

where the coded bits corresponding to the K information/data bits are assumed to be transmitted in N blocks, $I_i$ denotes the mutual information between transmitted symbols and the received symbols in the i-th block, and $L_i$ is the number of encoded symbols in the i-th block.

The present invention uses rateless coding with length estimation as a basis. The larger the scaling factor, the more bits are generated by the encoder. For fixed scaling factor schemes, the scaling factor is predetermined such that the performance of the whole system achieves the goal, for example, a pre-specified bit/symbol error rate. Since under different SNRs the overhead of a specific implementation of rateless code is different, the present invention uses an adaptive scaling factor scheme. In the present invention, the scaling factor for each SNR is predetermined to meet the performance goal. One possible method to determine the adaptive scaling factor is now described. The first step is to perform simulations to estimate the required overhead under different SNRs. Based on the simulation results, a look-up table is generated listing the scaling factors corresponding to various SNRs. If the SNR determined based on the channel conditions is not in the look-up table, then interpolation gives acceptable scaling factors. The required symbol coding length is estimated based on the channel SNR and the applied adaptive scaling factor also depends on the channel SNR. Under adaptive length estimation, Equation 1 becomes $$L > \frac{K}{I(X;Y)} \gamma(SNR) \quad \text{(Equation 3)}$$

where γ is now a function of SNR. For block-based schemes, Equation 2 becomes:

$$\sum_{i=1}^{N} \frac{I_i L_i}{\gamma_i} > K \quad \text{(Equation 4)}$$

where $\gamma_i$ is the scaling factor for the i-th block.

Figure 1B:
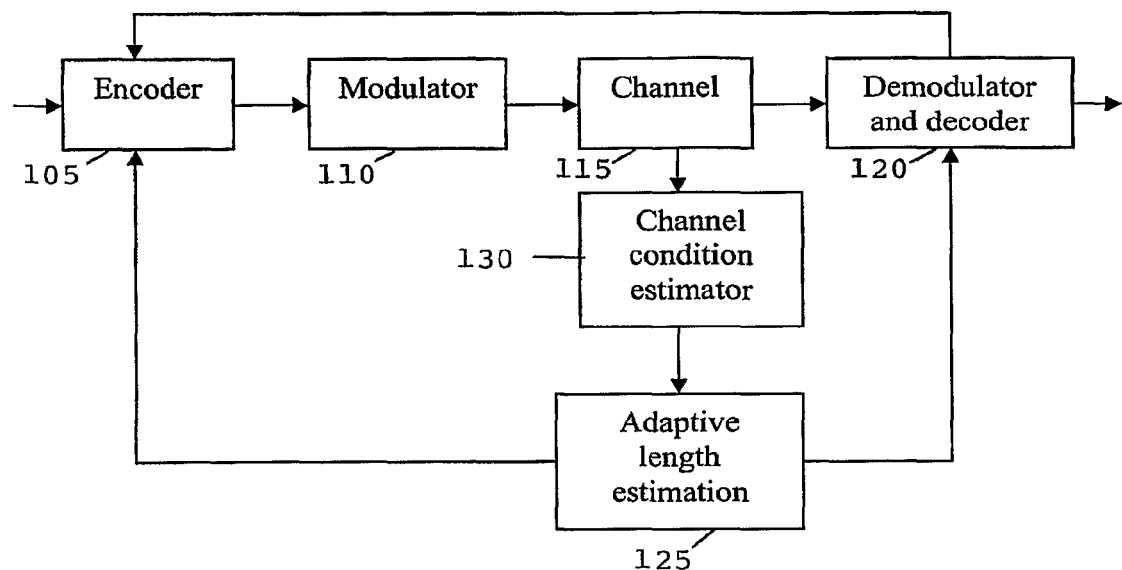
FIG. 1B is a block diagram of an alternative embodiment of the present invention.

FIGS. 1A and 1B illustrate two embodiments of the present invention using adaptive length estimation. The components are labeled similarly in both figures. Information/data is received by rateless encoder 105, which encodes the information/data and forwards the encoded information/data to modulator 110. Modulator 110 modulates the encoded information/data onto a carrier signal for transmission over channel 115. At the receive side, the encoded information/data is received by demodulator and decoder 120. The channel condition estimator 130 determines the channel SNR and forwards channel SNR to an adaptive length estimation component 125 and to demodulator and decoder 120. Adaptive length estimation component 125 calculates the length using adaptive scaling described above and shown in FIGS. 2A and 2B. Demodulator and decoder 120 provide acknowledgement to the encoder if the receiver decoded the coded block successfully. FIG. 1B provides the same functionality and the components are similarly labeled, however, the adaptive length estimation component 125 provides feedback to encoder 105 in order for the encoder 105 to effectively improve its ability to encode information/data based on more accurate length estimations. Another embodiment of this invention is that the receiver feeds back the estimated channel SNR to the transmitter. Both the transmitter and the receiver have the adaptive length estimation components.

Figure 2A:
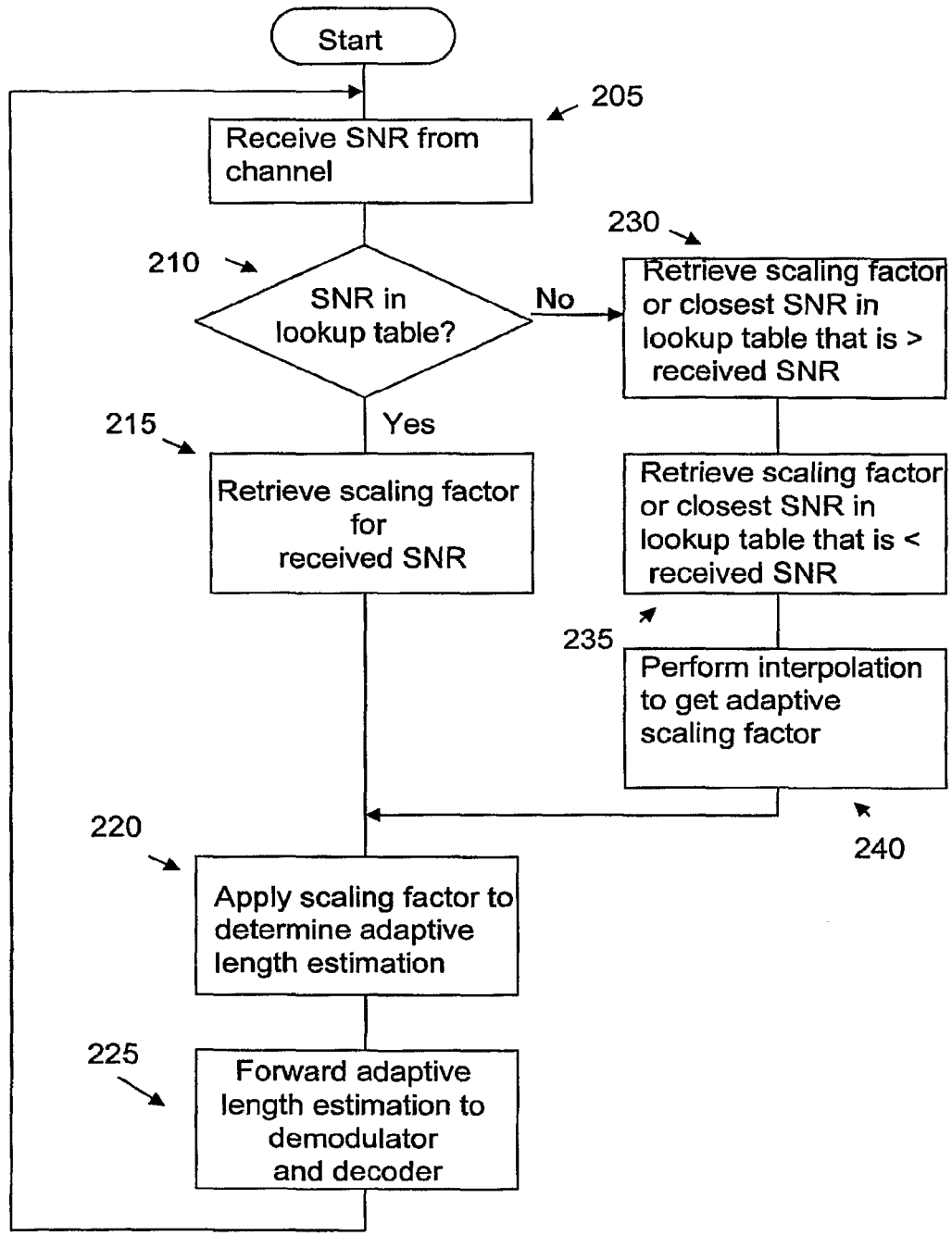
FIG. 2A is a flowchart of an exemplary embodiment of the method of adaptive length estimation corresponding to FIG. 1A.
Figure 2B:
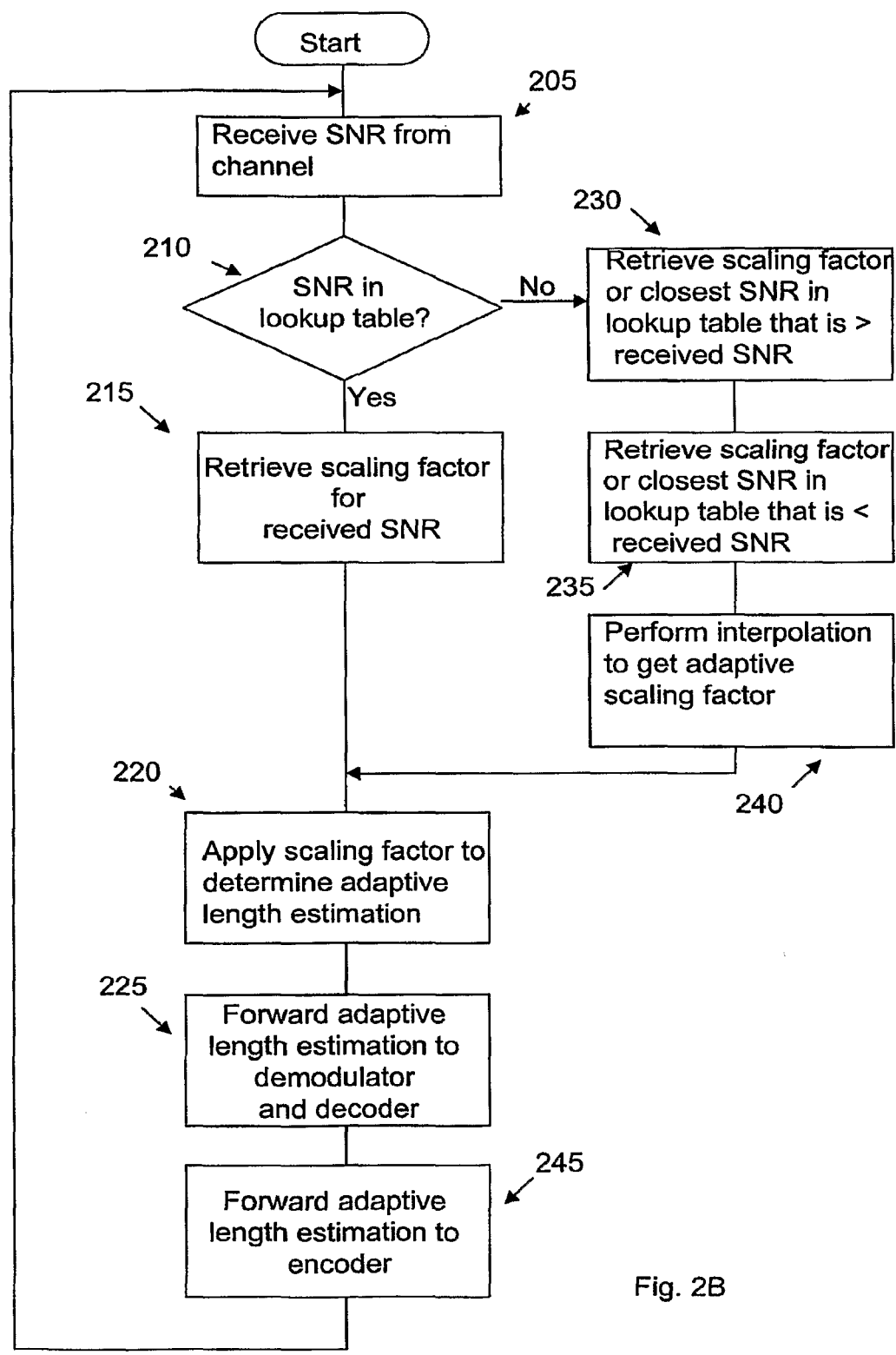
FIG. 2B is a flowchart of an alternative embodiment of the method of adaptive length estimation corresponding to FIG. 1B.

FIG. 2A is a flowchart of an exemplary embodiment of the method of adaptive length estimation corresponding to FIG. 1A. The adaptive length estimation component of FIG. 1A receives channel SNR from the channel condition estimator at 205. The method of the present invention then attempt to locate the received SNR in the lookup table that was generated based on simulations and is stored in memory or a storage system accessible by the adaptive length estimation component. A determination is made at 210 if the SNR is located in the lookup table. If the SNR is not in the lookup table then the closest SNR in the lookup table that is greater than the received SNR is retrieved at 230. Then the closest SNR in the lookup table that is less than the received SNR is retrieved at 235. The order in which these two steps is performed can, of course, be interchanged. Then an interpolation is performed to calculate the adaptive scaling factor at 240. If the SNR was located in the lookup table then the appropriate adaptive scaling factor is retrieved from the lookup table at 215. The retrieved or calculated adaptive scaling factor is applied to the adaptive length estimation formula to calculate an adaptive length estimation at 220. The adaptive length estimation is provided to the demodulator and decoder at 225. FIG. 2B is a flowchart of an alternative embodiment of the method of adaptive length estimation corresponding to FIG. 1B. FIG. 2B is very similar to FIG. 2A except that at 245, the calculated adaptive length estimation is forwarded to the encoder. In another embodiment of this invention, the interpolation of the adaptive scaling factor can utilizes more than two SNR points.

In the power adjustment method of the present invention, the power is adjusted to meet the deadline as described below. A practical communication system usually has deadlines to transmit information/data. Once the deadline is reached, the system has to give up if the encoded information/data was not received and decoded in time. In rateless code systems, if the required number of coded bits for successful decoding cannot be communicated before the deadline is reached, the receiver gives up and an error occurs. To increase the probability of successful decoding before the deadline, the present invention provides for power adjustment. The power adjustment scheme can also be used for saving power if, on the receive side, the decoding can be accomplished with less power or on the transmit side, the SNR is high enough that less coding needs to be performed on the information/data bits.

When the deadline is approaching but only a small number of extra bits are needed for successful decoding (according to the adaptive length estimation), it is inefficient for the decoder to give up and allow errors to occur. The ability to communicate the information/data before the deadline is reached (in time) is greater for a larger SNR. This means for a higher SNR, the decoder requires fewer coded bits. Under the same channel conditions, the SNR increases if the transmit power is increased. Therefore, if the channel SNR is known (or estimated accurately) and the number of required coded bits can be determined, the power can be adjusted to make the received bits decodable without sending additional coded bits. For example, if the estimated length is 1010 coded bits, but the deadline is within 1000 coded bits, the power can be increased to decrease the required length to 1000 coded bits or less such that the decoder can decode successfully. That is, fewer coded bits need to be generated and transmitted if the power has been increased because there is a corresponding increase in the SNR, which requires fewer encoded bits for successful receipt of the information/data. Furthermore, this power adjustment scheme can be applied whenever the rateless coding system determines that the deadline needs to be shortened or there is a benefit to be achieved from a power increase.

Correspondingly, the power level can be decreased if there is sufficient time to transmit more bits before the deadline. This saves the transmitter power consumption and reduces the interference.

Figure 3A:
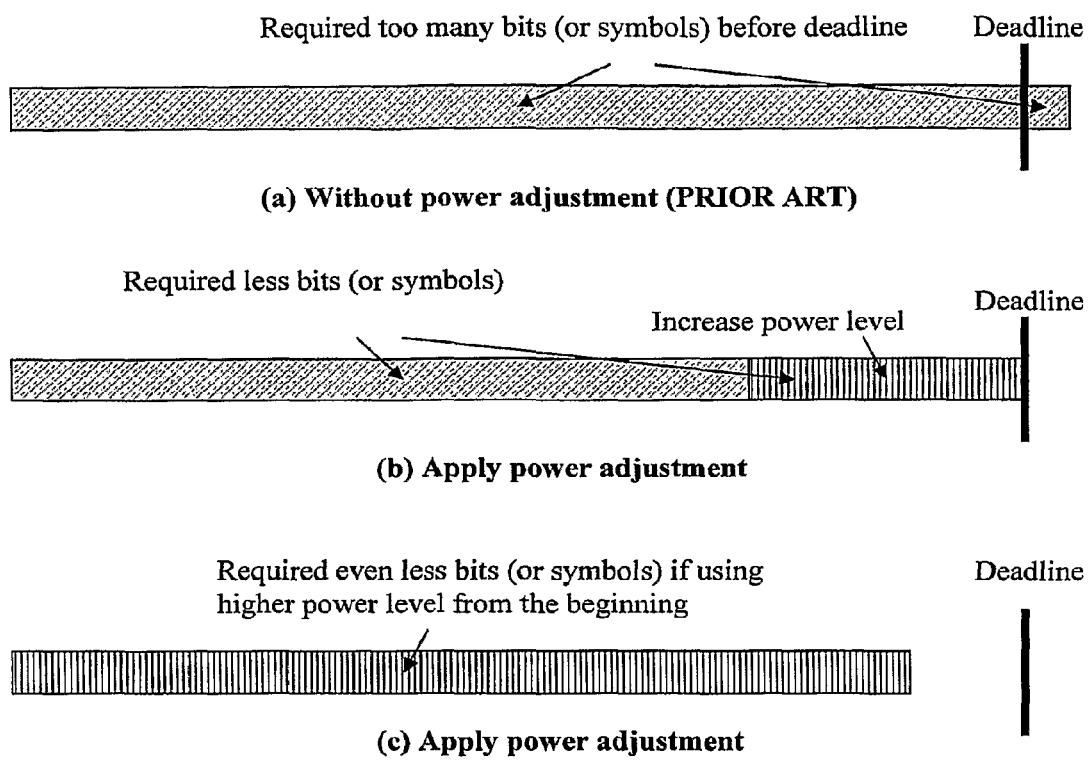
FIG. 3A shows a rateless coding scheme (a) without power adjustment, (b) with power adjustment and (c) power reduction on the receive side.
Figure 3B:
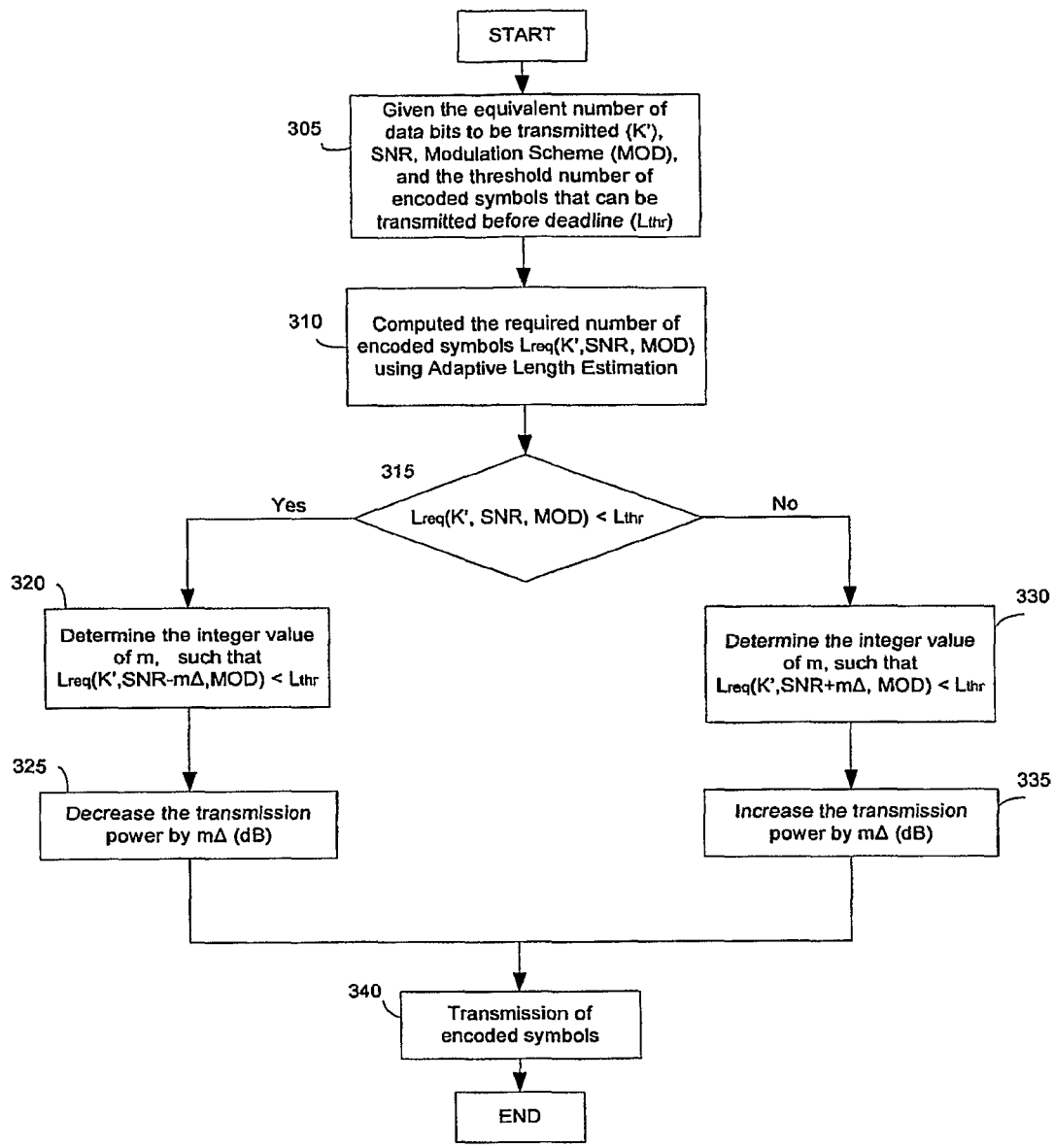
FIG. 3B is a flowchart of an exemplary embodiment of the method of power adjustment of the present invention.

FIG. 3A shows the results of applying a power adjustment to the rateless coding system of the present invention. Specifically, (a) of FIG. 3A shows a rateless coding scheme where no power adjustment has been made; (b) of FIG. 3A shows the application of power adjustment of the present invention to a rateless coding scheme; and (c) of FIG. 3A shows the ability of reduce power consumption on the receive side if fewer coded bits were required thereby saving power at the decoder (receiver). FIG. 3B is a flowchart of an exemplary embodiment of the power adjustment scheme of the present invention. Assuming N−1 (N≥1) blocks of encoded symbols are already transmitted and the equivalent number of information bits left to be encoded is denoted as K', where $$K' = K - \sum_{i=1}^{N-1} \frac{l_i L_i}{\gamma_i}.$$

Assuming further that the signal-to-noise ratio (SNR) and the modulation scheme (MOD) are known or have been determined, the required number of encoded symbols for successful decoding at the receiver side can be computed using the adaptive length estimation method of the present invention. Denoting the required number of encoded symbols as $L_{req}$ (K', SNR, MOD). The required number of encoded symbols is a function of the K', the SNR and the modulation scheme MOD. The maximum number of encoded symbols that can be sent out before the time deadline is denoted as $L_{thr}$ which is the product of the time duration before the deadline and the symbol rate. That is, $L_{thr}$ is a symbol threshold. The power adjustment step size, or equivalently the SNR adjustment step size is Δ (dB). Given the time duration and the symbol rate, the threshold number of encoded symbols that can be transmitted before the deadline $L_{thr}$ can be determined at 305. The required number of encoded symbols $L_{req}$ given the K', the current SNR and the current modulation scheme is calculated at 310. A test is performed at 315 to determine if the required number of encoded symbols $L_{req}$ is less than the threshold number of symbols $L_{thr}$. If the required number of encoded symbols $L_{req}$ is less than the threshold number of symbols $L_{thr}$ then it may be possible to reduce the transmission power level. At 320, a determination using Equation 3 is made of the integer, m, such that the required number of encoded symbols $L_{req}$ is less than the threshold number of symbols $L_{thr}$. Specifically, the power level can be reduced by mΔ dB. The power level is then decreased by mΔ dB at 325 and the encoded data is transmitted at 340 at the selected transmission power level. There are multiple ways to determine the integer, m. One simple method is to check if $L_{req}$(K', SNR−kΔ, MOD)<$L_{thr}$ holds starting with k=1, and increase k by 1 if the inequality holds until k can be determined such that $L_{req}$(K', SNR−kΔ, MOD)>$L_{thr}$. The integer m is equal to k−1. If the required number of encoded symbols $L_{req}$ is greater than the threshold number of symbols $L_{thr}$ then it may be possible to increase the transmission power level in order to increase the probability that the required number of coded bits can be transmitted before the deadline. At 330, a determination using Equation 3 is made of the integer, m, such that the required number of encoded symbols $L_{req}$ is less than the threshold number of symbols $L_{thr}$. Specifically, the power level can be increased by mΔ dB. The power level is then increased by mΔ dB at 335 and the encoded data is transmitted at 340 at the selected transmission power level.

Adaptive modulation can be accomplished by increasing the power and adaptively adjusting the modulation method. In a modulation scheme, when a transmitter is sending bits (encoded information/data) at a rate very close to the channel capacity, simply increasing the power will not provide much benefit. If the modulation scheme is switched to higher order of modulation, increasing the transmit power yields a shorter required length (in terms of symbols) for rateless codes. The present invention combines power adjustment with adaptive modulation for length estimation-based rateless codes. As long as the channel SNR can support a higher order modulation scheme, the modulation scheme can be switched to a higher order modulation scheme in order to benefit from the increased channel higher capacity. Following are two examples showing the use of adaptive modulation.

1. Under the QPSK modulation scheme at SNR equals 5 dB, a rate very close to the channel capacity results. Simply increasing the power will not provide much benefit. Switching to 16-QAM, which is a higher order modulation scheme than QPSK, results in more information/data being coded per symbol at the given SNR.
2. In a block fading channel and block transmission, and in the last block of transmission before the deadline, suppose that the length estimation shows that it is impossible to transmit enough bits under the current modulation scheme and power level. The method of the present invention can apply three strategies: if the current SNR is low, the power can be adjusted; if the current SNR is high enough and increasing the power level alone will not help, adaptively adjusting the modulation scheme along with power adjustment can be used to shorten the required length of encoded information/data to be transmitted (as well as received and decoded); if increasing the power level causes interference, adaptively adjusting the modulation scheme can be used alone without increasing the power level.

Figure 4A:
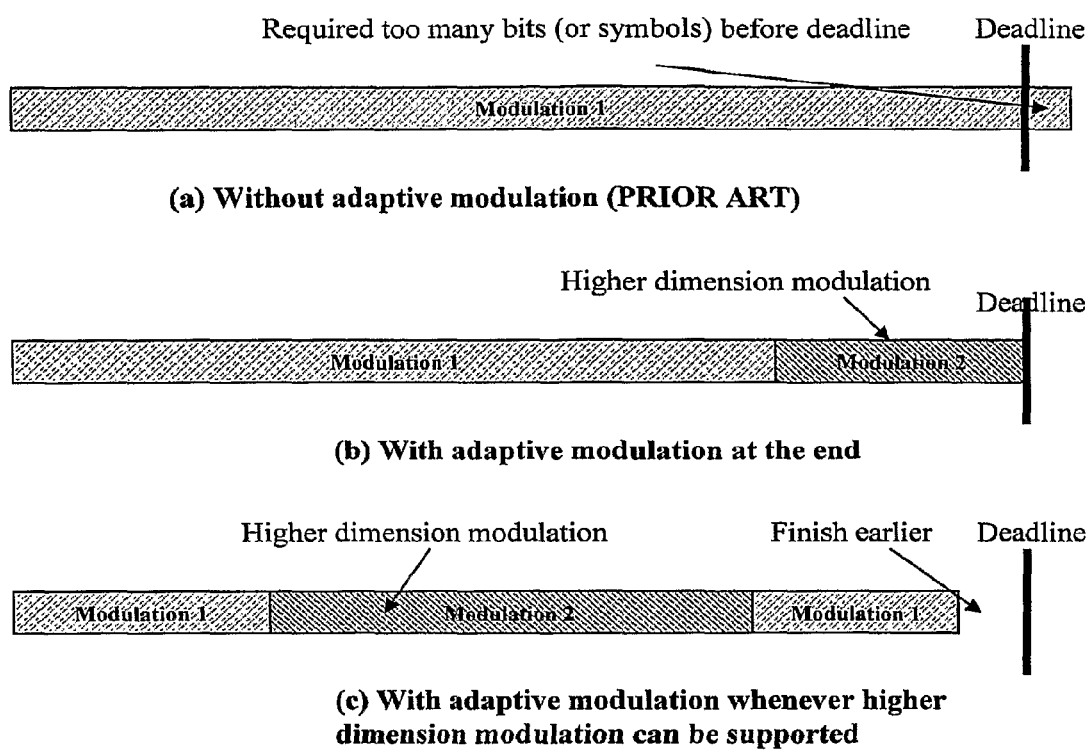
FIG. 4A shows a rateless coding scheme (a) without adaptive modulation, (b) with adaptive modulation near a deadline and (c) with adaptive modulation whenever it can be supported.
Figure 4B:
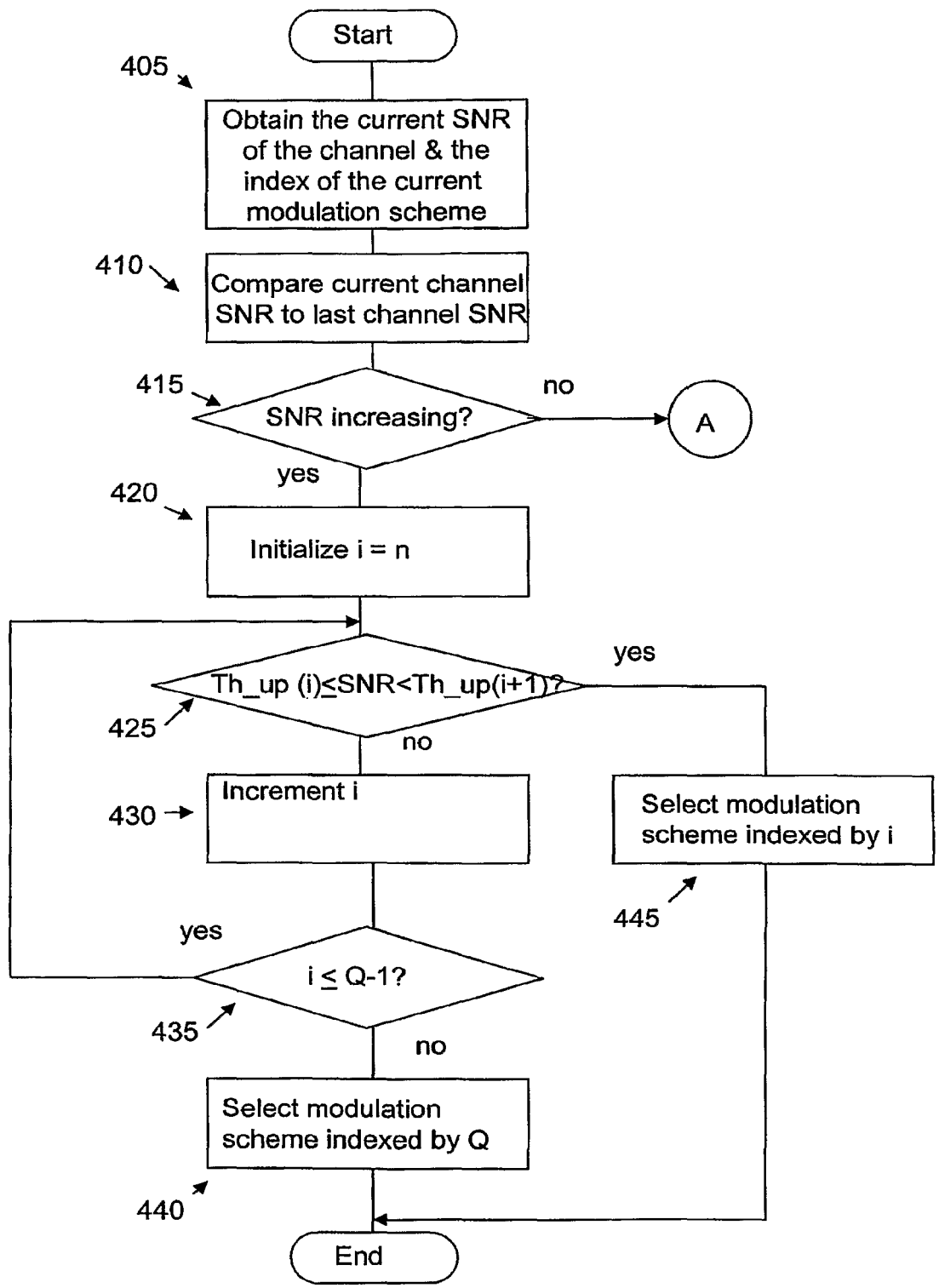
FIGS. 4B and 4C are flowcharts of an exemplary embodiment of the method of adaptive modulation of the present invention.
Figure 4C:
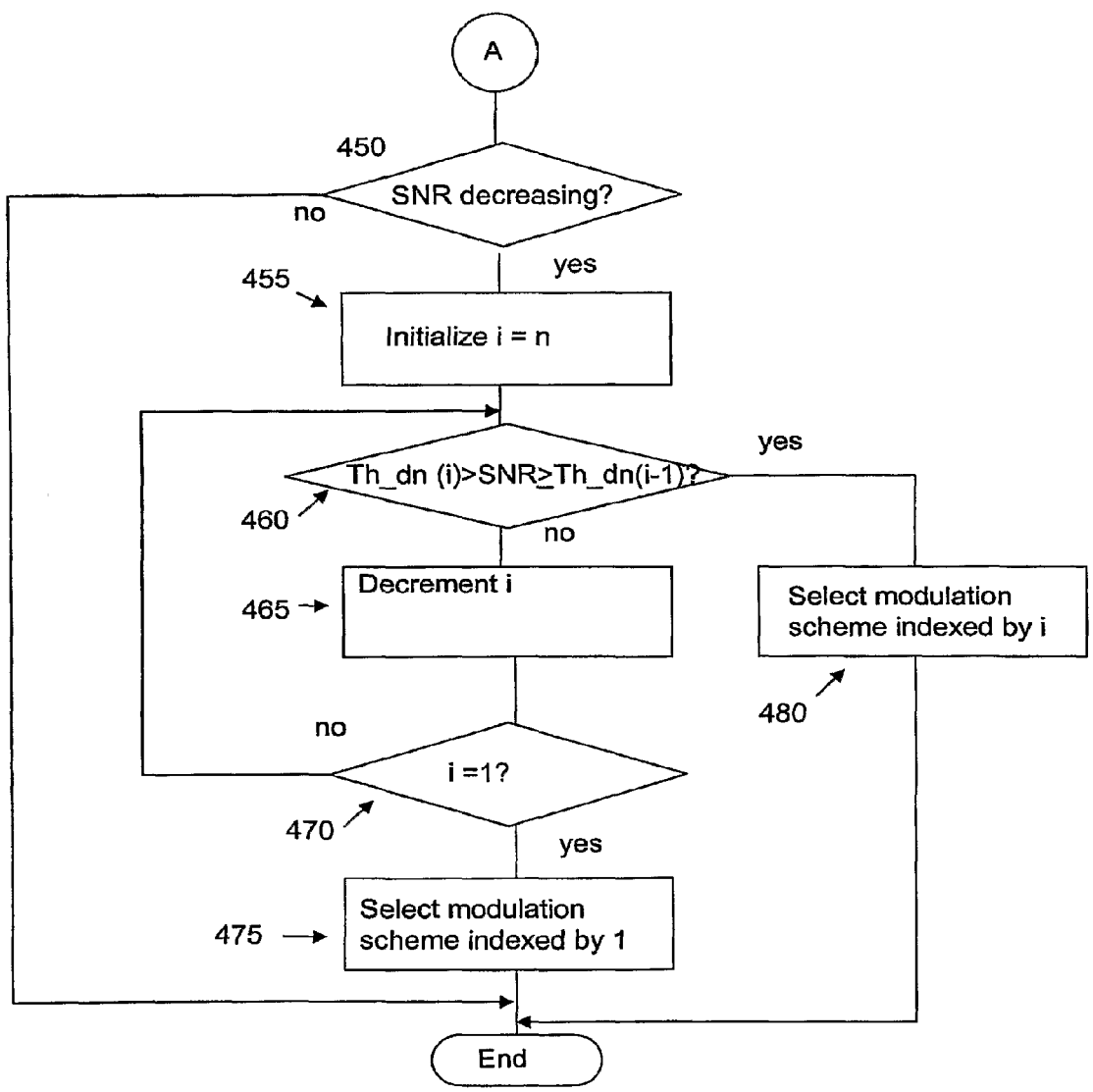

FIG. 4A shows a rateless coding scheme (a) without adaptive modulation, (b) with adaptive modulation near a deadline and (c) with adaptive modulation whenever it can be supported. FIGS. 4B and 4C are flowcharts of an exemplary embodiment of the method of adaptive modulation of the present invention. FIG. 4C is a continuation of FIG. 4B. Using, for example, the chart depicted in FIG. 5, for a given set of Q modulation schemes from which the system of the present invention can choose, for example, QPSK, 16-QAM, 64-QAM, and 256-QAM in increasing order of bits that each symbol can carry and denote the modulation schemes as MOD [i], i=1, 2, . . . , Q. A set of thresholds are selected that are used when the SNR is increasing. For simplicity, these increasing thresholds are denoted as Th_up[i], i=1, 2, . . . , Q. Further, a set of thresholds are selected that are used when the SNR is decreasing. For simplicity, these decreasing thresholds are denoted as Th_down[i], i=1, 2, . . . , Q. Table 1 below shows an example of such a table that is pre-determined and stored in memory or a storage system accessible to the present invention.

TABLE 1

| | modulation index i | | | |
|---|---|---|---|---|
| | 1 | 2 | 3 | 4 |
| MOD[i] | QPSK | 16-QAM | 64-QAM | 256-QAM |
| Th_up[i] (dB) | $-\infty$ | 5 | 9 | 12 |
| Th_down[i] | 4 | 8 | 11 | $+\infty$ |

Using Table 1, for example, if the SNR is increasing (over the previous SNR value) then the Th_up portion of the table would be used. For example, if the last reported SNR was 4.5 dB and the current SNR is 5.5 dB, then that would indicate that 16-QAM modulation could be used. If the previous modulation scheme was QPSK then a switch could be made to 16-QAM. Still assuming that the SNR was increasing and the last SNR was 5.5 dB and the current SNR is 7.5 dB, then that would indicate that no modulation scheme change could be made at the present time. If the current SNR is above 12 then 256-QAM will be used. The Th_down portion of Table 1 is used correspondingly, for a decreasing SNR.

Referring back to FIGS. 4B and 4C, and using a chart such as depicted in Table 1 above, the method of the present invention for adaptively adjusting the modulation scheme is now described. The current SNR for the channel is obtained as well as the index of the current modulation scheme at 405. The current SNR is compared to the last/previous SNR at 410. A test is performed at 415 to determine if the SNR of the channel is increasing. If the SNR of the channel is increasing then a counter is initialized to the current modulation scheme index at 420. The current SNR of the channel is compared against the increasing threshold of the current modulation scheme and the next higher order modulation scheme at 425. If the SNR of the channel is between the increasing thresholds of the current modulation scheme and the next higher order modulation scheme then the modulation scheme is selected based on the counter at 445. This may mean that the current modulation scheme selection is maintained. The counter is incremented at 430. The counter is tested at 435 to determine if it has been incremented to one less than its maximum. If the counter is still below the threshold, then the method proceeds to 425. If the counter has reached the threshold, then the modulation scheme selected is the highest order modulation scheme at 440. The method of the present invention has been described using an "up-counter" but a "down-counter" or any other equivalent mechanism could be used.

Continuing with FIG. 4C, a test is performed at 450 to determine if the SNR is decreasing. If the SNR is not decreasing then the current modulation scheme selection is maintained and nothing more need to be done at the present time. If the SNR is decreasing then a counter is initialized to the index of the current modulation scheme at 455. At 460, the current SNR of the channel is compared against the decreasing threshold of the current modulation scheme and the next lower order modulation scheme. If the SNR of the channel is between the decreasing thresholds of the current modulation scheme and the next lower order modulation scheme then the modulation scheme is selected based on the counter at 480. This may mean that the current modulation scheme selection is maintained. The counter is decremented at 465. The counter is tested at 470 to determine if it has been decremented to one. If the counter is not at the threshold, then the method proceeds to 460. If the counter has reached the threshold, then the modulation scheme selected is the lowest order modulation scheme at 475. The method of the present invention has been described using a "down-counter" but an "up-counter" or any other equivalent mechanism could be used.

Figure 5:
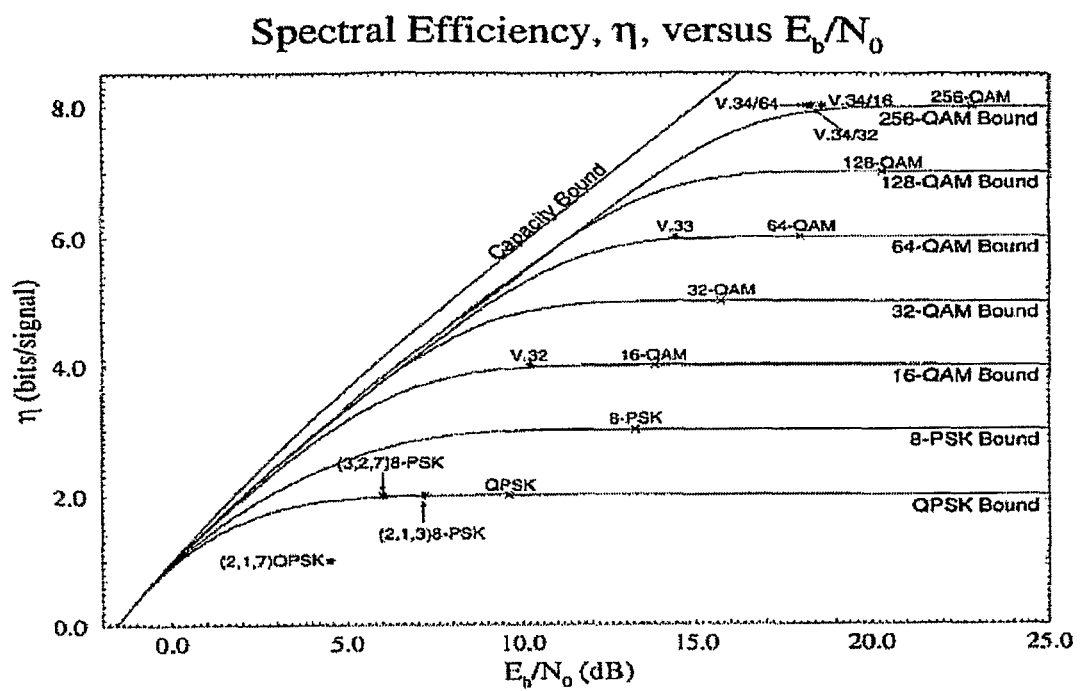
FIG. 5 is a chart of capacity versus SNR for different modulation schemes.

FIG. 5 is a chart of capacity versus SNR for different modulation schemes. The chart of FIG. 5 can be used to help determine which modulation scheme to adaptively select and provides the basis for the table described above. As can be seen from FIG. 5, there are a number of modulation schemes that are available. At various measured SNR values, different modulation schemes are suitable for data transmission. The modulation schemes available for the particular apparatus or system and the above chart or any similar chart can be used to generate a table such as depicted as Table 1 above or Table 2 below. Table 2 is an alternative embodiment of Table 1, where only one threshold is used instead of two (an increasing threshold and a decreasing threshold). Table 2 is an exemplary single threshold table, where Th[i], i=1, 2, . . . , Q.

TABLE 2

| | modulation index i | | | |
|---|---|---|---|---|
| | 1 | 2 | 3 | 4 |
| MOD[i] | QPSK | 16-QAM | 64-QAM | 256-QAM |
| Th[i] (dB) | $-\infty$ | 5 | 9 | 12 |

Figure 4D:
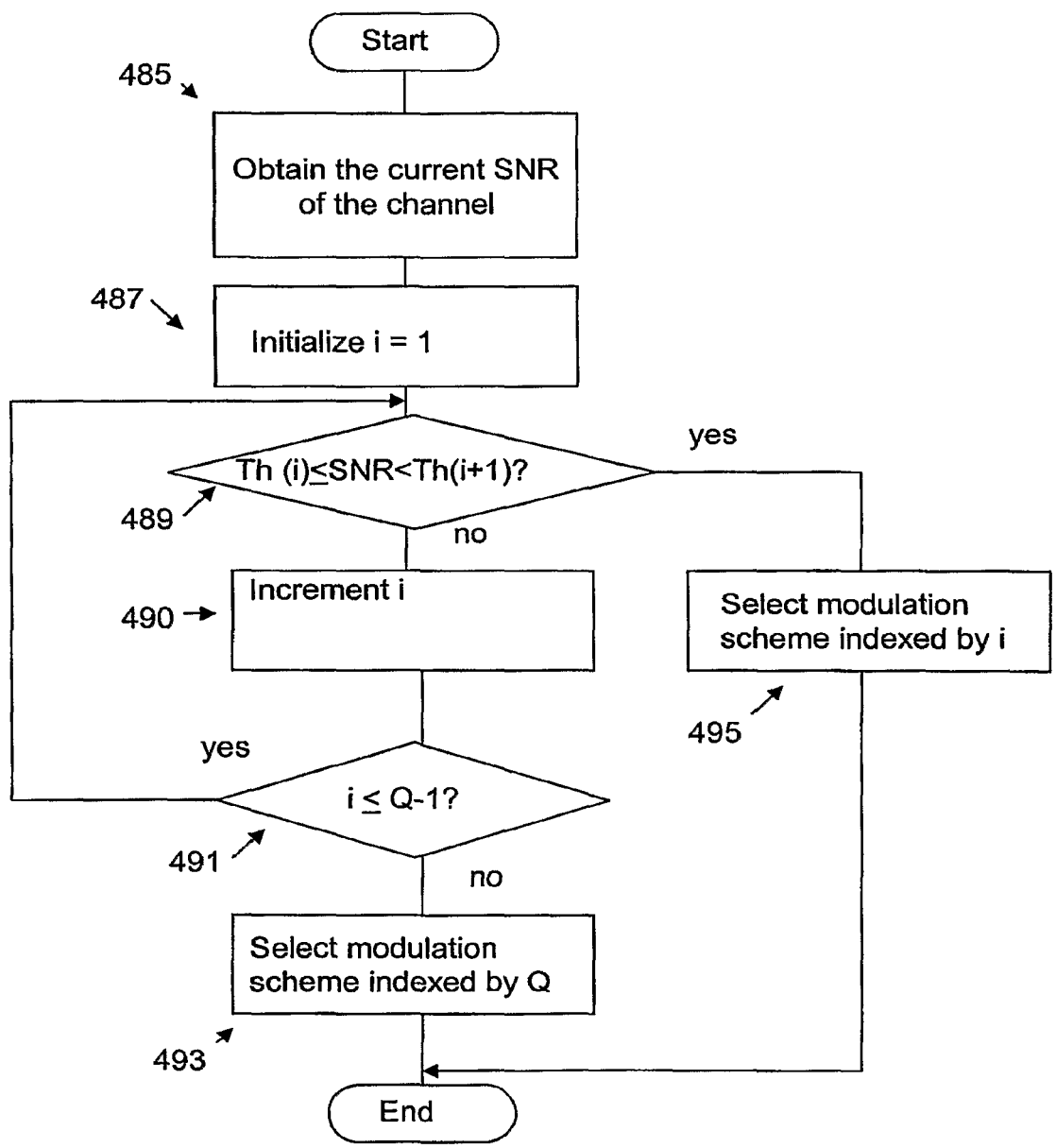
FIG. 4D is an alternative embodiment of the method of adaptive modulation of the present invention.

Referring now to FIG. 4D, which is a flowchart of an alternative embodiment of the adaptive modulation selection method of the present invention using a single threshold table such as Table 2. The current SNR for the channel is obtained at 485. A counter is initialized at 487. The current SNR of the channel is compared against the threshold of the current modulation scheme indexed by the counter and the next higher order modulation scheme indexed by the counter at 489. If the SNR of the channel is between the thresholds of the current modulation scheme indexed by the counter and the next higher order modulation scheme indexed by the counter then the modulation scheme is selected based on the counter at 495. This may mean that the current modulation scheme selection is maintained. The counter is incremented at 490. The counter is tested at 491 to determine if it has been incremented to one less than its maximum. If the counter is still below the threshold, then the method proceeds to 489. If the counter has reached the threshold, then the modulation scheme selected is the highest order modulation scheme at 493.

The adaptive length estimation method of the present invention is the basis for the transmitter's reaction to channel conditions. If the transmitter determines that the required length of bits can be encoded and transmitted before the deadline, then the transmitter can consider decreasing the power level to either save power or lower the inference. If the transmitter determines that the deadline cannot be met using current power level, the transmitter considers increasing the transmission power level up to the maximum possible transmission power level for the rateless communication system. If the current modulation scheme is very close to capacity, simply increasing power will not provide any appreciable benefit. Switching to a higher order modulation scheme is a better option.

The present invention is a multi-faceted approach to improving throughput and error performance in rateless coding systems. The components/facets of the method of the present invention are adaptive length compensation, power adjustment, and adaptive modulation.

Using adaptive scaling, the length estimation can be adaptively adjusted resulting in minimum encoding overhead, which, in turn, reduces the decoding overhead.

If adaptive length estimation alone does not result in improved performance (throughput and error) then adaptive length estimation can be combined with power adjustment. Power level increases result in increased SNR, which results in less required coding of information/data on the transmit side and the ability to decode the received information using less bits on the receive side. In the alternative, if the SNR of the channel is sufficient, the power level can be decreased to save power while still meeting the deadline for receipt and decoding of the information/data.

Adaptive length estimation can be combined with adaptively adjusting the modulation scheme. That is, a higher order modulation scheme, in which more information/data is encoded per symbol, is selected. This results in the ability of the transmitter to send fewer symbols, which saves energy/power. This means that the deadline can be met or shortened resulting in increased throughput.

Lastly, adaptive length estimation can be combined with both power adjustment and adaptive adjustment of the modulation scheme. When switching to a higher order modulation scheme, the ability to encode more information/data per symbol increases above a certain SNR. In combining power adjustment with adaptive modulation, the required encoded symbol length can be shortened.

Figure 6A:
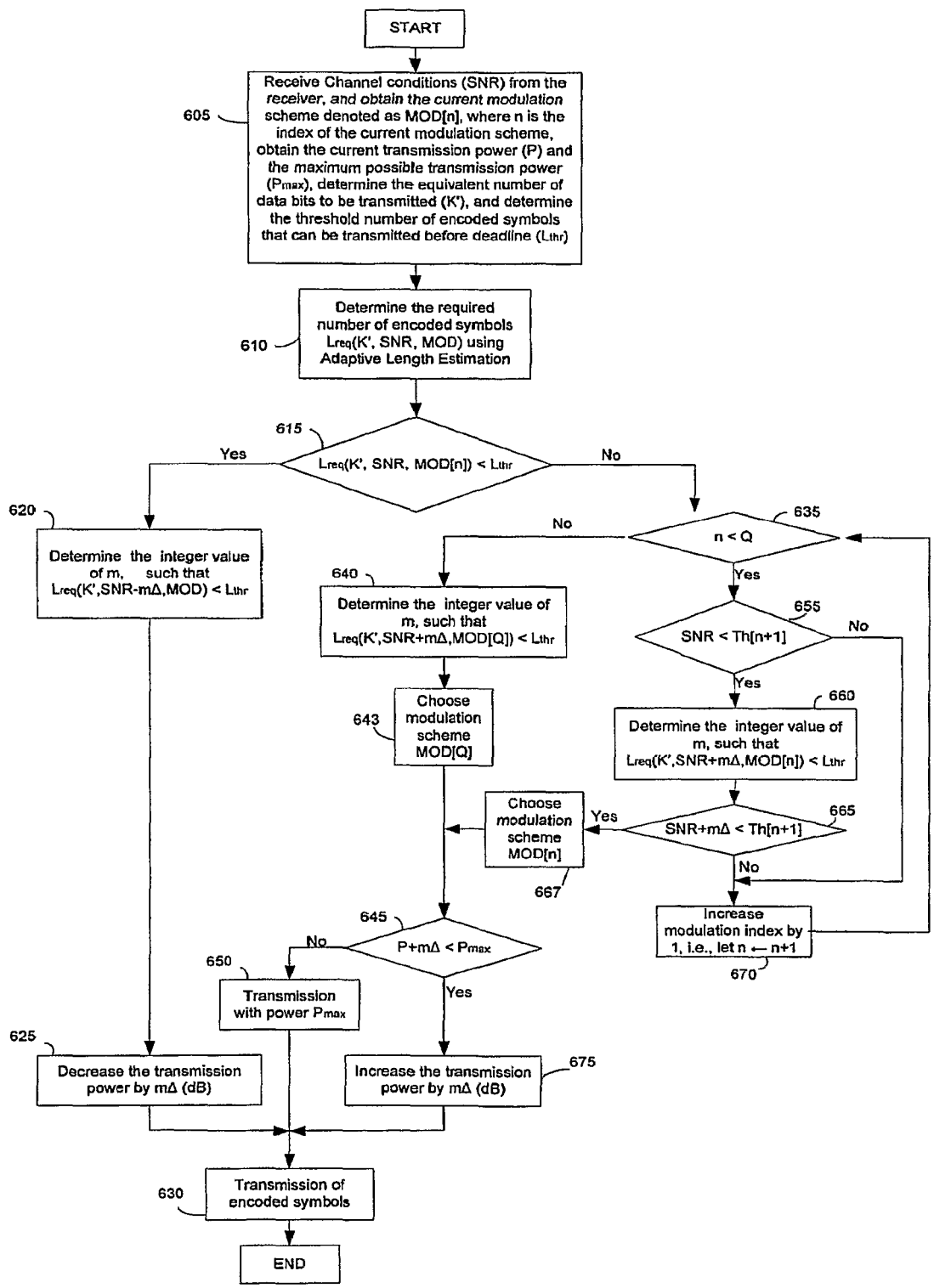
FIG. 6A is a flowchart of an exemplary embodiment of the transmission side of the method of the present invention.
Figure 6B:
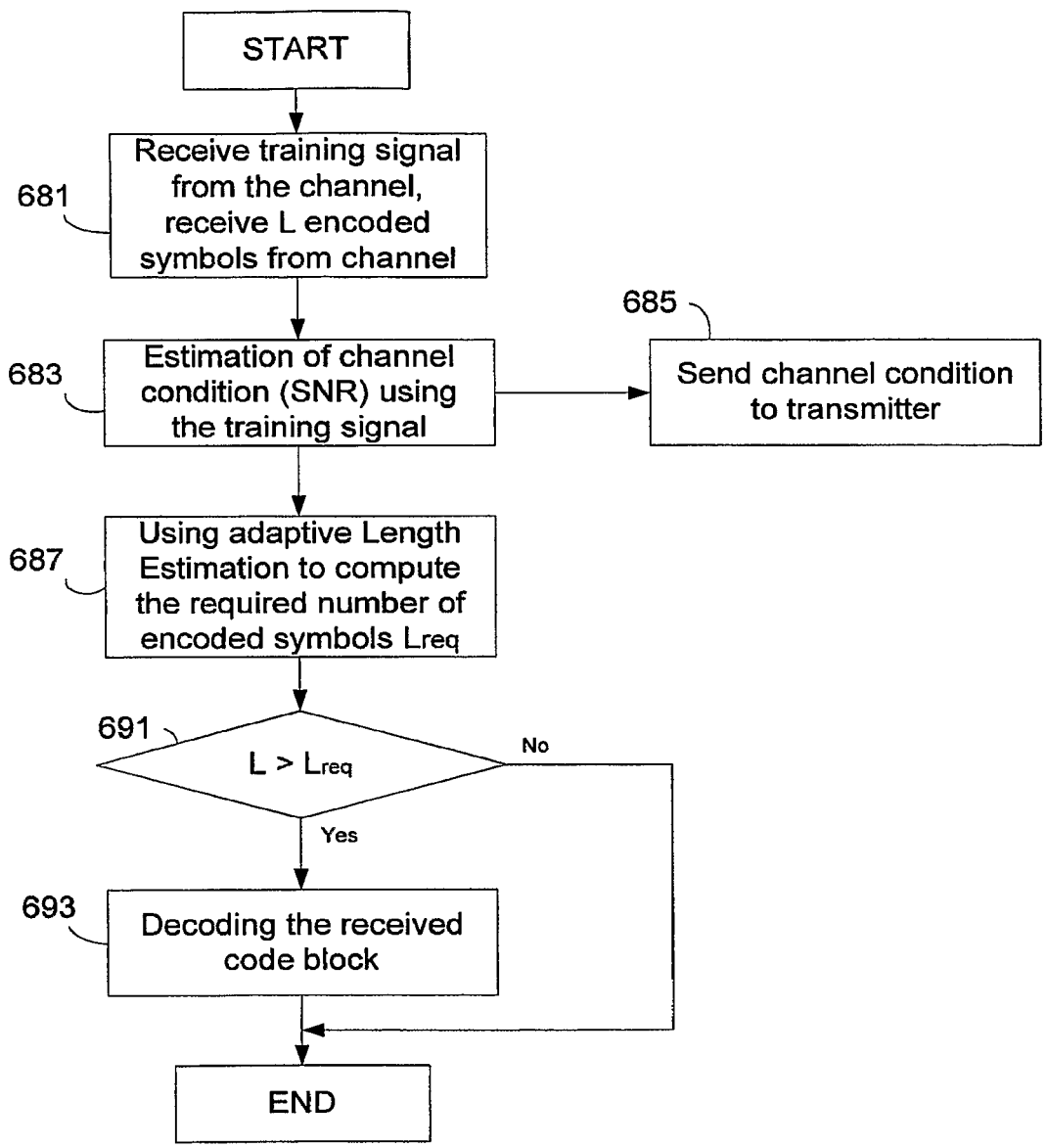
FIG. 6B is a flowchart of an exemplary embodiment of the receive side of the method of the present invention.

FIGS. 6A and 6B are flowcharts of exemplary embodiments of the method of the present invention. FIG. 6A is a flowchart of an exemplary embodiment of the method of the present invention on the transmit side and FIG. 6B is a flowchart of an exemplary embodiment of the method of the present invention on the receive side. The transmitter receives the channel SNR from the receiver at 605. Also at 605, the transmitter obtains the current modulation scheme and the index of the current modulation scheme as well as the current transmission power level and the maximum transmission power level. Also at 605, the transmitter determines the equivalent number of information/data bits left to transmitted (K') and obtains the threshold number of encoded symbols that can be transmitted before the deadline ($L_{thr}$). The transmitter determines the required number of encoded symbols $L_{req}$ using an adaptive length estimation method of the present invention at 610. The required number of encoded symbols $L_{req}$ is compared to the threshold number of encoded symbols that can be transmitted before the deadline at 615. If the required number of encoded symbols $L_{req}$ is less than the threshold number of encoded symbols that can be transmitted before the deadline $L_{thr}$ then it may be possible to reduce the transmission power level to conserve power. At 620, a determination using Equation 3 is made of the integer, m, such that the required number of encoded symbols $L_{req}$ is less than the threshold number of symbols $L_{thr}$. Specifically, the power level can be reduced by mΔ dB. The power level is then decreased by mΔ dB at 625 and the encoded data is transmitted at 630 at the selected transmission power level. If the required number of encoded symbols $L_{req}$ is greater than the threshold number of symbols $L_{thr}$ then it may be possible to increase the transmission power level in order to increase the probability that the required number of coded bits can be transmitted before the deadline or it may be possible to adaptively adjust the modulation scheme in order to increase the probability that the required number of coded bits can be transmitted before the deadline.

The index of the current modulation scheme is compared to Q at 635 in order to determine if the current modulation index is the index of the highest order modulation scheme. If the index of the current modulation scheme is not less than the index of the highest order modulation scheme, then it may be possible to increase the transmission power level in order to increase the probability that the required number of encoded symbols can be transmitted before the deadline. At 640, a determination using Equation 3 is made of the integer, m, such that the required number of encoded symbols $L_{req}$ is less than the threshold number of symbols $L_{thr}$. Specifically, the power level can be increased by mΔ dB. At 643, the modulation scheme indexed by Q (highest index, therefore, highest order modulation scheme) is selected. A test is performed at 645 to determine if the transmission power level is less than the maximum possible level. If the transmission power level is less than the maximum possible level then the power level is then increased by mΔ dB at 675 and the encoded data is transmitted at 630 at the selected transmission power level. If the transmission power level is not less than the maximum possible level then it must be at the maximum possible level so the maximum possible transmission power level is selected for transmission at 650. At this point, there is a probability of error since the transmission power is at the maximum possible level and no adaptive adjustments can be made to the modulation scheme. The encoded data is transmitted at 630 at the selected transmission power level.

If the index of the current modulation scheme is less than the highest order modulation scheme then the current SNR is compared to the threshold of the next highest order modulation scheme at 655. If the current SNR is less than the threshold of the next highest order modulation scheme, then a determination using Equation 3 is made of the integer, m, such that the required number of encoded symbols $L_{req}$ is less than the threshold number of symbols $L_{thr}$ at 660. A test is performed at 665 to determine if the current SNR plus the increase in the transmission power level is less than the threshold of the next highest order modulation scheme. If the current SNR plus the increase in the transmission power level is less than the threshold of the next highest order modulation scheme, then the modulation scheme indexed by the current modulation scheme index is selected at 667. The method proceeds to 645. If the current SNR plus the increase in the transmission power level is greater than or equal to the threshold of the next highest order modulation scheme, then the modulation scheme index is increased by 1 at 670.

Referring now to FIG. 6B, the receiver in a rateless communication system receives a training signal or other information regarding the channel conditions via any other known method as well as L encoded symbols over the channel at 681. The receiver estimates the SNR using the training signal or other information provided regarding the channel conditions at 683. The receiver forwards information regarding the channel conditions to the transmitter at 685. Using the adaptive length estimation method described above the receiver determines the minimum number of required encoded symbols, $L_{req}$, at 687. A test is performed to determine if at least the minimum required number of encoded symbols were received at 691. If the minimum required number of encoded symbols were received then the received symbols are decoded by the receiver at 693. If the minimum required number of encoded symbols were not received then no decoding is performed as it will not be possible to properly decode the received symbols.

Figure 7:
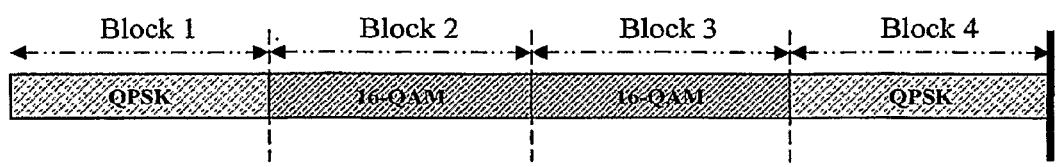
FIG. 7 illustrates the results of extending adaptive modulation of the present invention to block based coding schemes.
Figure 8A:
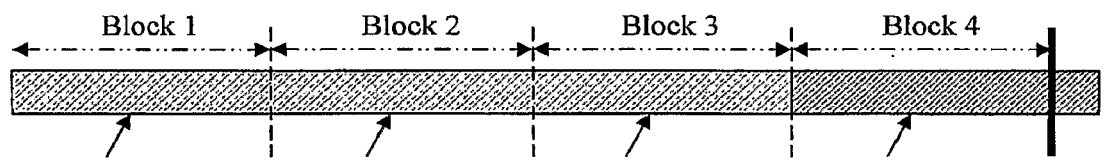
FIG. 8A shows a block based coding scheme without applying any power adjustment.
Figure 8B:
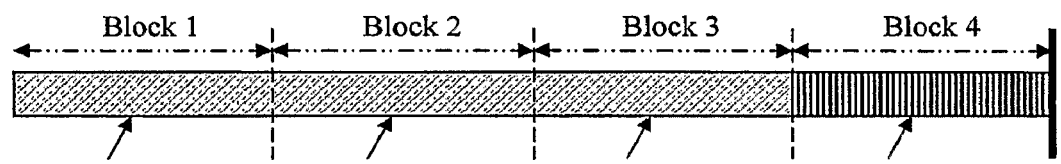
FIG. 8B shows a block based coding scheme applying the power adjustment of the present invention.

Although the schemes presented above do not mention the concept of blocks, they can be applied as well to any block-based system. Block-based systems are those in which the information is transmitted block-by-block, in a discrete manner. In this scenario, power adjustment and adaptive modulation can be applied in a block-by-block manner. For example, the adaptive modulation of the present invention can be switched to another modulation method when a new block is transmitted, but cannot be changed within a block. FIG. 7 illustrates the results of extending adaptive modulation of the present invention to block based coding schemes. The same is true for power adjustments. FIG. 8A shows a block based coding scheme without applying any power adjustment as in the prior art. FIG. 8B shows a block based coding scheme applying the power adjustment of the present invention. However, if a communication system can support instantaneous switching from one modulation method to another, the schemes described above can be employed in that case as well.

Figure 9:
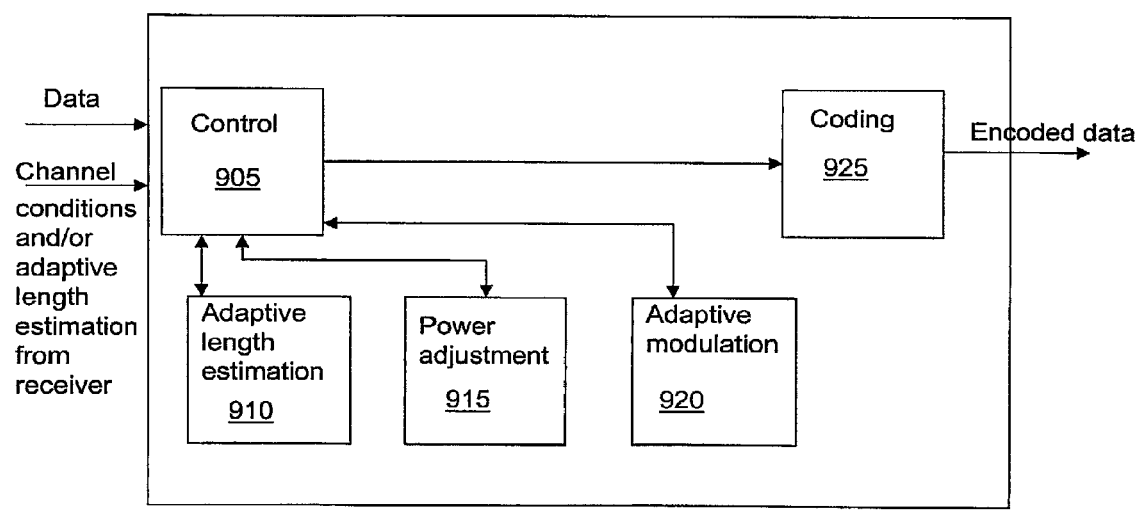
FIG. 9 is a block diagram of the present invention.

Referring now to FIG. 9, which is a block diagram of an encoder in accordance with the principles of the present invention, control module 905 receives information/data and channel conditions and/or an adaptive length estimation from a receiver that operates in accordance with the principles of the present invention. Operating using the method outlined in FIG. 6A or any method designed to produce the same result, the control module determines which methods to use to best increase the probability of successful encoding and transmission of the data/information. If the encoder receives channel conditions then the encoder first invokes the adaptive length estimation module 910 to determine the minimum required number of encoded bits that must be generated from the raw data/information. If the encoder receives an adaptive length estimation from the receiver then the encoder may bypass this component and its determination. Based on the tests and determinations made by control module 905, power adjustment module 915 may be invoked. Further based on the tests and determinations made by control module 905, adaptive modulation module 920 may be invoked. Based on the tests and determinations made by control module 905, both power adjustment module 915 and adaptive modulation module 920 may be invoked. Once the control module has made the appropriate adjustments, then the data is forwarded to the coding module 925 to perform the encoding in accordance with the transmission power and modulation scheme selected.

It is to be understood that the present invention may be implemented in various forms of hardware, software, firmware, special purpose processors, or a combination thereof. Preferably, the present invention is implemented as a combination of hardware and software. Moreover, the software is preferably implemented as an application program tangibly embodied on a program storage device. The application program may be uploaded to, and executed by, a machine comprising any suitable architecture. Preferably, the machine is implemented on a computer platform having hardware such as one or more central processing units (CPU), a random access memory (RAM), and input/output (I/O) interface(s). The computer platform also includes an operating system and microinstruction code. The various processes and functions described herein may either be part of the microinstruction code or part of the application program (or a combination thereof), which is executed via the operating system. In addition, various other peripheral devices may be connected to the computer platform such as an additional data storage device and a printing device.

It is to be further understood that, because some of the constituent system components and method steps depicted in the accompanying figures are preferably implemented in software, the actual connections between the system components (or the process steps) may differ depending upon the manner in which the present invention is programmed. Given the teachings herein, one of ordinary skill in the related art will be able to contemplate these and similar implementations or configurations of the present invention.

The invention claimed is:

1. A method for adaptively adjusting data communications of a rateless channel coding system, said method comprising: adaptively estimating a symbol coding length based on channel conditions through training signals;
a first act of determining a symbol threshold, wherein the symbol threshold is a product of a time duration before a deadline and a symbol rate;
a second act of determining if said adaptively estimated symbol coding length is less than said symbol threshold;
adjusting a transmission power level based on said second determining act; and
adaptively adjusting a modulation scheme based on said second determining act.

2. The method according to claim 1, further comprising: receiving channel condition information;
determining said modulation scheme;
determining said transmission power level; and
wherein said adaptively estimated symbol coding length is based on said channel condition information, said modulation scheme and said transmission power level.

3. The method according to claim 2, further comprising: determining a time duration allocated for the data communications before a deadline;
determining a symbol rate of said rateless communication system; and
wherein said symbol threshold is based on said time duration and said symbol rate.

4. The method according to claim 1, wherein said transmission power level is decreased if said adaptively estimated symbol coding length is less than said symbol threshold.

5. The method according to claim 3, wherein said transmission power level is increased up to a maximum possible transmission power level if said modulation scheme is equal to a highest order modulation scheme of said rateless communication system and said adaptively estimated symbol coding length is one of greater than and equal to said symbol threshold.

6. The method according to claim 3, wherein said modulation scheme is adaptively adjusted if said modulation scheme is less than a highest order modulation scheme of said rateless communication system and said adaptively estimated symbol coding length is one of greater than and equal to said symbol threshold.

7. The method according to claim 1, wherein said rateless communication system is a block-based rateless coding system and further wherein adaptive adjustments to said modulation scheme are performed on a block-by-block basis.

8. The method according to claim 2, further comprising: determining an adaptive scaling factor based on said channel condition information; and
applying said scaling factor to determine said adaptively estimated symbol coding length.

9. A system for adaptively adjusting data communications of a rateless channel coding system, comprising:
means for adaptively estimating a symbol coding length based on channel conditions estimated through training signals;
a first means for determining a symbol threshold, and wherein the symbol threshold is a product of a time duration before a deadline and a symbol rate;
a second means for determining if said adaptively estimated symbol coding length is less than said symbol threshold;
means for adjusting a transmission power level based on said second determining means; and
means for adaptively adjusting a modulation scheme based on said second determining means.

10. The system according to claim 9, further comprising:
means for receiving channel condition information;
means for determining said modulation scheme;
means for determining said transmission power level; and
wherein said adaptively estimated symbol coding length is based on said channel condition information, said modulation scheme and said transmission power level.

11. The system according to claim 10, further comprising:
means for determining a time duration allocated for the data communications before a deadline;
means for determining a symbol rate of said rateless communication system; and
wherein said symbol threshold is based on said time duration and said symbol rate of said rateless communication system.

12. The system according to claim 9, wherein said transmission power level is decreased if said adaptively estimated symbol coding length is less than said symbol threshold.

13. The system according to claim 11, wherein said transmission power level is increased up to a maximum possible transmission power level if said modulation scheme is equal to a highest order modulation scheme of said rateless communication system and said adaptively estimated symbol coding length is one of greater than and equal to said symbol threshold.

14. The system according to claim 13, wherein said modulation scheme is adaptively adjusted if said modulation scheme is less than said highest order modulation scheme of said rateless communication system and said adaptively estimated symbol coding length is one of greater than and equal to said symbol threshold.

15. The system according to claim 9, wherein said rateless communication system is a block-based rateless coding system and further wherein adaptive adjustments to said modulation scheme are performed on a block-by-block basis.

16. The system according to claim 10, further comprising:
determining an adaptive scaling factor based on said channel condition information; and
applying said scaling factor to determine said adaptively estimated symbol coding length.

17. A method for decoding communication of a rateless channel coding system, said method comprising: receiving encoded symbols;
determining a threshold number of encoded symbols, wherein said threshold is an adaptively estimated symbol coding length and wherein the symbol threshold is a product of a time duration before a deadline and a symbol rate;
determining if a length of said received encoded symbols is greater than said threshold number of encoded symbols; and
decoding said received encoded symbols if said length of said received encoded symbols is greater than said threshold number of encoded symbols.

18. The method according to claim 17, further comprising:
estimating channel conditions;
determining an adaptive length estimation based on said estimated channel conditions; and
determining said threshold number of encoded symbols based on said adaptive length estimation.

19. The method according to claim 18, wherein said estimated channel conditions include a signal-to-noise ratio.

20. The method according to claim 18, wherein said channel conditions are estimated based on a training signal.

21. An apparatus for decoding communication of a rateless channel coding system, comprising:
means for receiving encoded symbols;
means for determining a threshold number of encoded symbols,
and wherein said threshold in an adaptively estimated symbol coding length and wherein the symbol threshold is a product of a time duration before a deadline and a symbol rate; means for determining if a length of said received encoded symbols is greater than said threshold number of required encoded symbols; and
means for decoding said received encoded symbols if said length of said received encoded symbols is greater than said threshold number of encoded symbols.

22. The apparatus according to claim 21, further comprising:
means for estimating channel conditions;
means for determining an adaptive length estimation based on said estimated channel conditions; and
means for determining said threshold number of encoded symbols based on said adaptive length estimation.

23. The apparatus according to claim 22, wherein said estimated channel conditions include a signal-to-noise ratio.

24. The apparatus according to claim 22, wherein said channel conditions are estimated based on a training signal.

* * * * *